US012791639B2

(12) United States Patent
Taniguchi et al.

(10) Patent No.: US 12,791,639 B2
(45) Date of Patent: Nov. 10, 2026

(54) EXAMINATION TABLE APPARATUS AND MEDICAL IMAGING SYSTEM HAVING AUTOMATICALLY SLIDABLE COIL CONNECTORS BASED ON COIL CABLE LENGTH

(71) Applicant: FUJIFILM Corporation, Tokyo (JP)

(72) Inventors: Takeshi Taniguchi, Tokyo (JP); Kazuyuki Kato, Tokyo (JP); Satoshi Iizuka, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 70 days.

(21) Appl. No.: 18/946,838

(22) Filed: Nov. 13, 2024

(65) Prior Publication Data

US 2025/0164587 A1 May 22, 2025

(30) Foreign Application Priority Data

Nov. 16, 2023 (JP) ................................ 2023-195259

(51) Int. Cl.
*G01R 33/30* (2006.01)
*G01R 33/28* (2006.01)

(52) U.S. Cl.
CPC ......... *G01R 33/307* (2013.01); *G01R 33/283* (2013.01)

(58) Field of Classification Search
None
See application file for complete search history.

(56) References Cited

U.S. PATENT DOCUMENTS

2007/0035301 A1 2/2007 Nakabayashi et al.
2021/0030306 A1* 2/2021 Leussler ................ A61B 5/055
2021/0199738 A1* 7/2021 Ikeda .................. A61B 6/0442
2023/0301597 A1* 9/2023 Spring .................. A61B 5/055

FOREIGN PATENT DOCUMENTS

JP H06315473 11/1994

OTHER PUBLICATIONS

"Office Action of Co-pending U.S. Appl. No. 18/946,835", issued on Mar. 4, 2026, pp. 1-23.
THK, "Non-magnetic Components with High Hardness and Precision", retrieved on Jun. 23, 2026, pp. 1-4. Available 1 at: https://www.thk.com/eu/en/news/products/article-04082022-1.html.

* cited by examiner

*Primary Examiner* — Keith M Raymond
*Assistant Examiner* — Ashish S. Jasani
(74) *Attorney, Agent, or Firm* — JCIPRNET

(57) ABSTRACT

Provided are an examination table apparatus that can reduce a burden placed on a user regarding sliding of a connector, and a medical imaging system including such an examination table apparatus. An aspect of the present invention relates to an examination table apparatus used in a medical imaging apparatus, the examination table apparatus including: a top plate on which a subject is placed; a connector that is provided on the top plate and to which a coil for capturing an image of the subject is connected; a processor; and a sliding mechanism that slides the connector in a longitudinal direction of the top plate, in which the processor is configured to: acquire an imaging condition of the subject; and control the sliding mechanism based on the acquired imaging condition, to cause the connector to perform first sliding.

15 Claims, 13 Drawing Sheets

EXAMINATION TABLE APPARATUS AND MEDICAL IMAGING SYSTEM HAVING AUTOMATICALLY SLIDABLE COIL CONNECTORS BASED ON COIL CABLE LENGTH

CROSS-REFERENCE TO RELATED APPLICATION

The present application claims priority under 35 U.S.C § 119 (a) to Japanese Patent Application No. 2023-195259 filed on Nov. 16, 2023, which is hereby expressly incorporated by reference, in its entirety, into the present application.

BACKGROUND OF THE INVENTION

1. Field of the Invention

The present invention relates to an examination table apparatus and a medical imaging system, and more particularly to an examination table apparatus including a slidable connector and a medical imaging system comprising such an examination table apparatus.

2. Description of the Related Art

In a medical imaging apparatus, such as a magnetic resonance imaging apparatus (MRI apparatus), it is known that a connector for connecting a coil used for imaging is provided in an examination table apparatus. It is preferable that a cable for connecting the coil and the connector is short, and thus a connector that can be handled by a short cable by sliding on a top plate of the examination table apparatus is used (for example, see JP1994-315473A (JP-H06-315473A)).

SUMMARY OF THE INVENTION

In a case in which the imaging is performed by using the coil, it is necessary to exchange the coil for each examination or attach a plurality of types of coils in accordance with an imaging part or an imaging condition. In this case, since a place in which the coil should be installed and a cable length are different for each coil, a burden of thinking about an appropriate position of the connector or sliding the connector to the position is placed on a user such as a radiologic technologist. However, in JP1994-315473A (JP-H06-315473A), it is necessary for the user to consider an appropriate position of the connector by himself/herself and slide the connector to the appropriate position.

As described above, the related art cannot reduce the burden placed on the user regarding the sliding of the connector.

The present invention has been made in view of such circumstances, and an object of the present invention is to provide an examination table apparatus that can reduce a burden placed on a user regarding sliding of a connector, and a medical imaging system comprising such an examination table apparatus.

In order to achieve the above-described object, a first aspect of the present invention relates to an examination table apparatus used in a medical imaging apparatus, the examination table apparatus comprising: a top plate on which a subject is placed; a connector that is provided on the top plate and to which a coil for capturing an image of the subject is connected; a processor; and a sliding mechanism that slides the connector in a longitudinal direction of the top plate, in which the processor is configured to: acquire an imaging condition of the subject; and control the sliding mechanism based on the acquired imaging condition, to cause the connector to perform first sliding.

According to the first aspect, the processor controls the sliding mechanism based on the imaging condition to cause the connector to perform the first sliding, so that it is not necessary for a user, such as a radiologic technologist, to consider an appropriate position of the connector or to slide the connector to the appropriate position, and a burden placed on the user regarding the sliding of the connector can be reduced.

It should be noted that, in the first aspect, the position, the number, and the movable range of the connector are not particularly limited.

A second aspect relates to the examination table apparatus according to the first aspect, in which the processor is configured to: determine a connector that is caused to perform the first sliding among the connectors and a first sliding position that is a target position of the first sliding, based on the imaging condition; and slide the determined connector to the determined first sliding position. The second aspect defines specific processing of the first sliding.

A third aspect relates to the examination table apparatus according to the first to second aspect, further comprising: an imaging apparatus that is configured to capture images of the subject and the coil, in which the processor is configured to: determine whether or not a cable length required to connect the coil to the connector that has performed the first sliding is within a range of a cable length of the coil, based on the image; and in a case in which the determination is made as being affirmative, detect whether or not the coil is connected to the connector. The third aspect defines processing based on the image acquired by the imaging apparatus.

A fourth aspect relates to the examination table apparatus according to the third aspect, in which the processor is configured to: perform the determination based on the image of the subject acquired by the imaging apparatus; in a case in which the determination is made as being negative, determine a second sliding position that is a target position of second sliding for moving the connector that has performed the first sliding into the range of the cable length of the coil; and in a case in which the second sliding position falls within a movable range of the connector, slide the connector to the second sliding position. The fourth aspect defines the second sliding based on the image of the subject acquired by the imaging apparatus, and the adjustment can be further performed after the first sliding by the second sliding.

A fifth aspect relates to the examination table apparatus according to the fourth aspect, in which the processor is configured to: in a case in which the second sliding position does not fall within the movable range of the connector, cause an output device to output a message prompting a user of the examination table apparatus to move the subject.

A sixth aspect relates to the examination table apparatus according to the third aspect, in which the processor is configured to: perform the determination based on the image of the coil acquired by the imaging apparatus; in a case in which the determination is made as being negative, determine a second sliding position that is a target position of second sliding for moving the connector that has performed the first sliding into the range of the cable length of the coil; and in a case in which the second sliding position falls within a movable range of the connector, slide the connector to the second sliding position. The sixth aspect defines the second sliding based on the image of the coil acquired by the imaging apparatus, and the fine adjustment after the first sliding can be performed by the second sliding.

A seventh aspect relates to the examination table apparatus according to the sixth aspect, in which the processor is configured to: in a case in which the second sliding position does not fall within the movable range of the connector, cause an output device to output a message prompting a user of the examination table apparatus to move the subject.

An eighth aspect relates to the examination table apparatus according to any one of the first to seventh aspects, in which the imaging condition includes at least an imaging part of the subject.

A ninth aspect relates to the examination table apparatus according to any one of the first to eighth aspects, in which the connector includes a plurality of connectors, and the processor is configured to slide the plurality of connectors independently of each other. According to the ninth aspect, it is possible to handle various sliding positions.

A tenth aspect relates to the examination table apparatus according to any one of the first to ninth aspects, in which the processor is configured to: in a case in which the coil is removed from the connector, slide the connector to a predetermined position. According to the tenth aspect, the burden placed on the user regarding the sliding of the connector at the end of the imaging can be reduced.

An eleventh relates to the examination table apparatus according to any one of the first to tenth aspects, in which the processor is configured to: in a case in which imaging based on one imaging condition is terminated and another imaging condition is designated, slide the connector based on the other imaging condition. According to the eleventh aspect, the next examination can be performed promptly.

A twelfth aspect relates to the examination table apparatus according to any one of the first to eleventh aspects, in which the top plate has an opening or a groove that is formed in the longitudinal direction of the top plate, and the connector is slidable in the opening or the groove.

A thirteenth aspect relates to the examination table apparatus according to the twelfth aspect, further comprising: a support member that supports the connector; and a holding member that holds the support member, that is disposed in a lateral direction of the top plate and projected in the longitudinal direction, and that is fixed to the top plate, in which the processor is configured to: slide the support member with respect to the holding member via the sliding mechanism, to slide the connector. The thirteenth aspect defines one aspect of the sliding mechanism.

A fourteenth aspect relates to the examination table apparatus according to the thirteenth aspect, in which a gap between the connector and the opening or the groove is shielded by at least one of the support member or the holding member. According to the fourteenth aspect, it is possible to prevent an article used in the examination table apparatus or the periphery thereof from falling off from the gap between the connector and the opening or the groove, the article or a finger of the subject from being pinched in the gap, or the liquid from being spilled, and the safety of the examination table apparatus is improved.

A fifteenth aspect relates to the examination table apparatus according to any one of the first to fourteenth aspects, in which the processor is configured to: in a case in which the subject in a state in which the coil is attached is placed on the top plate, slide the connector to a position overlapping a range in which the coil is present in the longitudinal direction of the top plate. According to the fifteenth aspect, it is possible to shorten the cable routing.

A sixteenth aspect relates to the examination table apparatus according to any one of the first to fifteenth aspects, in which the medical imaging apparatus is a magnetic resonance imaging apparatus.

In order to achieve the above-described object, a seventeenth aspect of the present invention relates to a medical imaging system comprising: the examination table apparatus according to any one of the first to sixteenth aspects; and the medical imaging apparatus. According to the seventeenth aspect, as in the first aspect, the burden placed on the user regarding the sliding of the connector can be reduced.

As described above, with the examination table apparatus and the medical imaging system according to the aspects of the present invention, the burden placed on the user regarding the sliding of the connector can be reduced.

DESCRIPTION OF THE PREFERRED EMBODIMENTS

Hereinafter, preferred embodiments of a medical imaging system and an examination table apparatus according to an embodiment the present invention will be described with reference to the accompanying drawings. It should be noted that, in the accompanying drawings, in some cases, some components are not shown for convenience of description. Further, the accompanying drawings do not show accurate shapes and dimensions of the examination table apparatus and the medical imaging system.

Entire Configuration of Magnetic Resonance Imaging System

Figure 1:
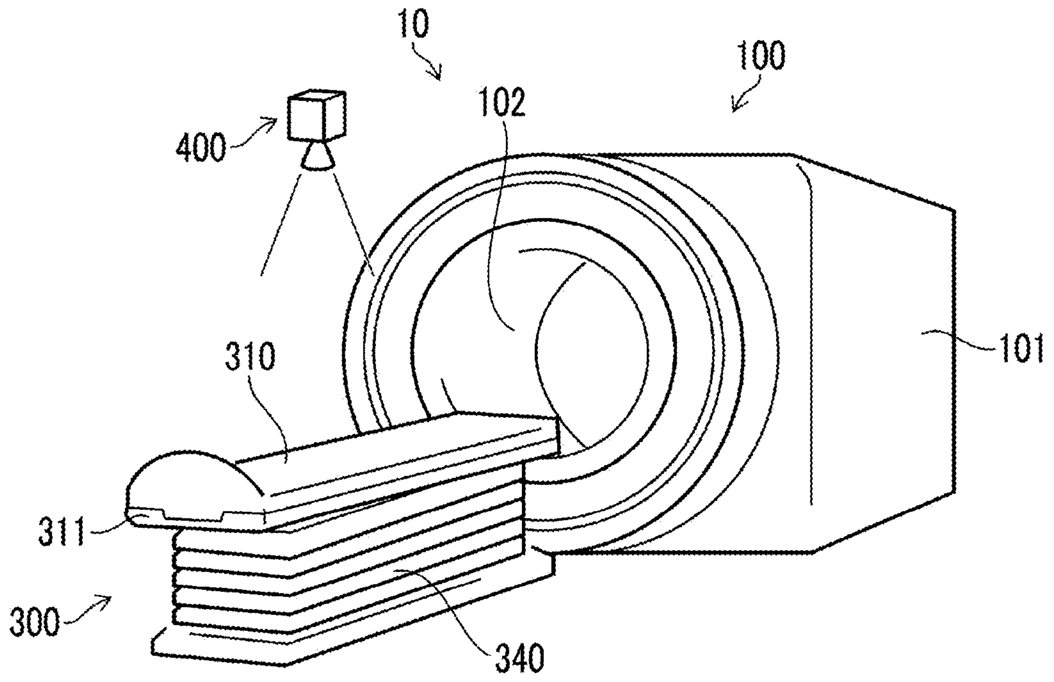
FIG. 1 is a diagram showing an entire configuration of a magnetic resonance imaging system according to an embodiment of the present invention.

First, an entire configuration of the magnetic resonance imaging system will be described. As shown in FIG. 1, a magnetic resonance imaging system 10 (medical imaging system) according to the embodiment of the present invention comprises a magnetic resonance imaging apparatus 100 (medical imaging apparatus) and an examination table apparatus 300 (examination table apparatus).

The magnetic resonance imaging apparatus 100 is an apparatus that acquires a tomographic image of a subject 110 (subject; see FIG. 2), and in the present embodiment, the magnetic resonance imaging apparatus 100 is a magnetic resonance imaging (MRI) apparatus that uses a nuclear magnetic resonance (NMR) phenomenon. FIG. 1 shows a tunnel bore type MRI apparatus comprising a cylindrical gantry, as an example of the magnetic resonance imaging apparatus 100. An apparatus body 101 includes a cylindrical tunnel 102 of which an axial direction is horizontal, and generates a static magnetic field in the tunnel 102 to form an imaging space. The apparatus body 101 is disposed in an electromagnetically shielded room, and a gradient magnetic field power supply 132, a sequencer 140, a high-frequency oscillator 151, a modulator 152, a high-frequency amplifier 153, a signal amplifier 162, a quadrature phase detector 163, an A/D converter 164, a controller 170, and the like (see FIG. 2) are disposed outside the electromagnetically shielded room and are electrically connected to the apparatus body 101 via a cable.

Configuration of Magnetic Resonance Imaging Apparatus

Figure 2:
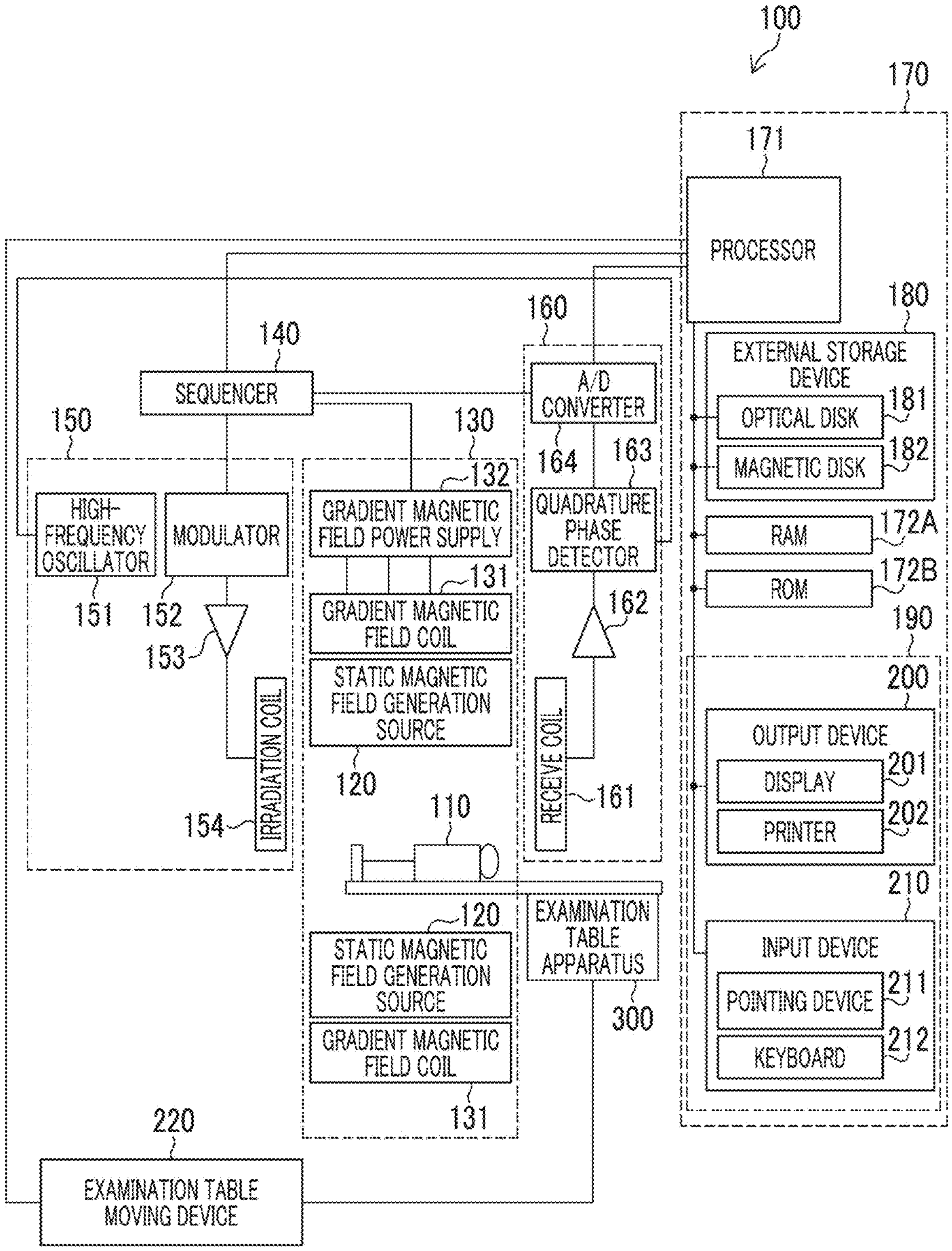
FIG. 2 is a diagram showing a configuration of a magnetic resonance imaging apparatus.

FIG. 2 is a diagram showing a configuration of the magnetic resonance imaging apparatus 100. As shown in FIG. 2, the magnetic resonance imaging apparatus 100 comprises a static magnetic field generation source 120, a gradient magnetic field generation unit 130, the sequencer 140, a high-frequency irradiation unit 150, a signal detection unit 160, and the controller 170.

The static magnetic field generation source 120 comprises a power supply and a superconducting coil (static magnetic field generation coil) (both of which are not shown), and generates a uniform static magnetic field in a static magnetic field space accommodating the subject 110 in a direction orthogonal to a body axis of the subject 110 in a case of a vertical magnetic field method, or in a body axis direction of the subject 110 in a case of a horizontal magnetic field method. The static magnetic field generation source 120 is disposed around the subject 110. The current and the voltage of the superconducting coil are measured by an ammeter and a voltmeter (not shown), and are input to a processor 171 (controller 170). It should be noted that the static magnetic field generation coil may be a normal conducting coil instead of the superconducting coil.

Returning to FIG. 2, the gradient magnetic field generation unit 130 includes gradient magnetic field coils 131 (gradient magnetic field generation coils) that generate gradient magnetic fields in three axial directions of X, Y, and Z, which are a coordinate system (stationary coordinate system) of the magnetic resonance imaging apparatus 100, and a gradient magnetic field power supply 132 that drives each of the gradient magnetic field coils 131, in a superimposed form in the static magnetic field space. Gradient magnetic fields Gx, Gy, and Gz are generated in the three axial directions of X, Y, and Z by driving the gradient magnetic field power supply 132 of each coil in response to an instruction, that is, control from the sequencer 140 described later. During imaging, a slice direction gradient magnetic field pulse (Gs) is applied in a direction orthogonal to a slice plane (imaging cross section) to set the slice plane with respect to the subject 110, and a phase encoding direction gradient magnetic field pulse (Gp) and a frequency encoding direction gradient magnetic field pulse (Gf) are applied in the remaining two directions orthogonal to the slice plane and orthogonal to each other to encode positional information in each direction in an echo signal.

The sequencer 140 repeatedly applies high-frequency magnetic field pulses (RF pulses) and gradient magnetic field pulses in a predetermined pulse sequence. The sequencer 140 operates based on the control of the processor 171 and transmits various instructions, that is, controls required for collection of data of the tomographic image of the subject 110 to the gradient magnetic field generation unit 130, the high-frequency irradiation unit 150, and the signal detection unit 160.

The high-frequency irradiation unit 150 irradiates the subject 110 with the RF pulse to cause nuclear magnetic resonance in the atomic nucleus spin of the atom constituting a biological tissue of the subject 110. The high-frequency irradiation unit 150 includes the high-frequency oscillator 151, the modulator 152, the high-frequency amplifier 153, and an irradiation coil 154 (high-frequency coil) that is a transmission-side high-frequency coil. The subject 110 is irradiated with electromagnetic waves by amplitude-modulating the RF pulse, which is output from the high-frequency oscillator 151, via the modulator 152 at a timing based on the instruction from the sequencer 140, amplifying the amplitude-modulated RF pulse via the high-frequency amplifier 153, and then supplying the amplified RF pulse to the irradiation coil 154 disposed near the subject 110.

The signal detection unit 160 detects the echo signal that is an NMR signal released by the nuclear magnetic resonance of the nuclear spins constituting the biological tissue of the subject 110. The signal detection unit 160 includes a receive coil 161 (high-frequency coil, RF receive coil; coil) that is a reception-side high-frequency coil, the signal amplifier 162, the quadrature phase detector 163, and the A/D converter 164 (analog/digital converter). The NMR signal as a response induced in the subject 110 by the electromagnetic waves applied from the irradiation coil 154 is detected by the receive coil 161 disposed near the subject 110, amplified by the signal amplifier 162, and then divided into signals of two systems orthogonal to each other by the quadrature phase detector 163 at the timing based on the instruction from the sequencer 140, and each of the signals is converted into a digital amount by the A/D converter 164 and then transmitted to the controller 170.

Configuration of Receive Coil

The receive coil 161 (coil) is configured as, for example, a unit comprising a plurality of receive coil elements and a receiver formed in a loop shape and disposed in a secondary element array shape, and receives a signal from the subject. The image of the subject is captured (reconstructed) by using the signal received by the receive coil 161. In the magnetic resonance imaging system 10, as the receive coil 161, a coil for imaging various parts, such as a head, a spine, an abdomen, a leg, and an arm, can be used. The number of coils used in one imaging may be one or plural, and a plurality of coils (for example, a coil for a spine and a coil for abdomen) for imaging different parts may be used simultaneously.

An overall shape of the receive coil 161 is, for example, a blanket shape, a sheet shape, or a semi-cylindrical shape, and may be configured by combining a plurality of band-shaped members and the like. The cable is pulled out from an end part of such the blanket or the sheet. The number of cables may be one or plural depending on the imaging part or the like. A connector (not shown) of a cable end part is connected to a connector 322 provided on a top plate 310 (top plate).

Configuration of Controller

The controller 170 executes various types of data processing, displays the processing results, and stores the processing results. The controller 170 includes the processor 171, a storage device such as a random access memory (RAM) 172A and a read only memory (ROM) 172B, an external storage device 180 such as an optical disk 181 and a magnetic disk 182, and an input/output unit 190. In a case in which the signal detection unit 160 receives the signal or the data, the processor 171 executes processing such as signal processing and image reconstruction by using the RAM 172A as a work area, displays the tomographic image of the subject 110 as the result thereof on an output device 200, and records the tomographic image in the external storage device 180. In a case of executing these types of processing, the processor 171 can refer to a program or data recorded on the ROM 172B.

Under the control of the processor 171, the controller 170 can supply power a superconducting coil 124 (static magnetic field generation coil) from a power supply 122, and measure the supplied current and the voltage between current lead terminals of the superconducting coil 124 by using an ammeter 126 and a voltmeter 128. In addition, the controller 170 detects a magnetic body based on these measurement results to output the result.

The input/output unit 190 performs input and output of various control information of the magnetic resonance imaging apparatus 100 and control information of the processing executed by the controller 170, specifically, performs input, reception, and display of imaging parameters of the pulse sequence and the like. In addition, the input/output unit 190 receives an operation of issuing an instruction for the power supply to the static magnetic field generation coil, and outputs information indicating the power supply state or the measured voltage. The input/output unit 190 consists of an input device 210 including a pointing device 211 such as a trackball, a mouse, a pad, or a touch panel, and a keyboard 212, and an output device 200 including a display 201 such as a cathode-ray tube (CRT) or a liquid crystal display (LCD), and a printer 202. The input device 210 may be disposed near the output device 200, and, for example, an operator may interactively control the input device 210 while viewing the display 201, to instruct the magnetic resonance imaging apparatus 100 to execute various types of processing via the pointing device 211. In addition, the input operation may be performed by disposing the touch panel that operates as the input device 210 on a display surface of the display 201, and selecting or operating the display content of the display 201.

In addition, the input/output unit 190 may comprise an audio input/output device such as a microphone or a speaker, and this device allows the operator to perform an operation by audio via the microphone, or notification may be issued to the operator or the like by audio.

The subject 110 is placed on the top plate 310 of the examination table apparatus 300 and is accommodated in the static magnetic field space, which is the imaging space, by an examination table moving device 220 (see FIG. 2). The irradiation coil 154 on the transmission side and the gradient magnetic field coil 131 are installed in the static magnetic field space in which the subject 110 is accommodated, to face the subject 110 in a case of a vertical magnetic field method and to surround the subject 110 in a case of a horizontal magnetic field method. The receive coil 161 on the reception side is actually installed to face an imaging target part of the subject 110 or to surround the imaging target part. The receive coil 161 having a sheet shape may be laid on the top plate 310, the subject 110 may lie down on the sheet, and an end part of the sheet may be wound on the abdomen side (back side in a case in which the subject 110 is lying down in a prone state) for use. It should be noted that the subject may also be referred to as an examination subject.

It should be noted that, as the imaging target nuclide of the current MRI apparatus, a hydrogen atom nucleus (proton), which is a main constituent substance of the subject 110, is widely used in clinical practice. By visualizing information on a spatial distribution of a proton density or a spatial distribution of a relaxation time of an excited state, a morphology or a function of the human body, such as the head, the abdomen, or the limbs, is imaged two-dimensionally or three-dimensionally.

In the magnetic resonance imaging apparatus 100 according to the present embodiment, the processor 171 may include, for example, various processors as a hardware structure as follows. The "various processors" include, for example, a central processing unit (CPU) which is a general-purpose processor executing software (program) to function as various processing units, a programmable logic device (PLD), such as a field programmable gate array (FPGA), which is a processor of which a circuit configuration can be changed after manufacture, and a dedicated electric circuit, such as an application specific integrated circuit (ASIC), which is a processor of which a dedicated circuit configuration is designed to execute specific processing.

The processor 171 may be configured by one of these various processors, or may be configured by two or more processors of same type or different types (for example, a plurality of FPGAs or a combination of the CPU and the FPGA). Further, a plurality of processing units may be configured by one processor. As a first example the configuration of the plurality of processing units by one processor, there is a form in which one processor is configured by combining one or more CPUs and software, and this processor functions as the plurality of processing units, as represented by a computer, such as a client or a server. Second, there is a form in which a processor, which achieves the functions of the entire system including the plurality of processing units with one integrated circuit (IC) chip, is used, as represented by a system on chip (SoC) or the like. In this way, various processing units can be configured by one or more of the various processors described above, as the hardware structure.

The hardware structures of these various processors are, more specifically, an electric circuit (circuitry) in which the circuit elements, such as semiconductor elements, are combined. It should be noted that, in a case in which the various processors operate, a program or data recorded on a non-transitory tangible recording medium, such as the ROM 172B, can be referred to, and a recording medium, such as the RAM 172A, can be used as a transitory work area during the operation.

Configuration of Examination Table Apparatus

Figure 3:
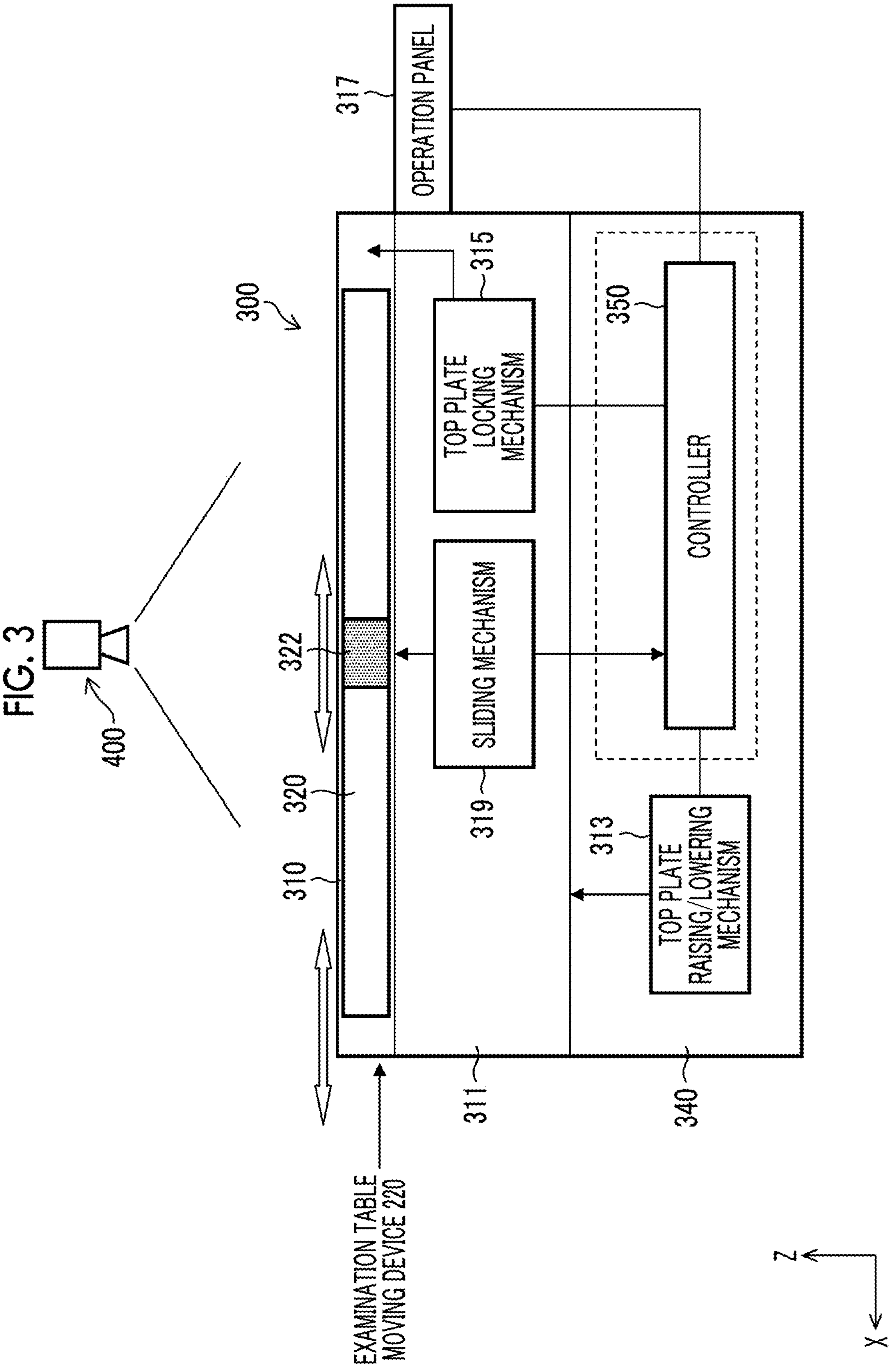
FIG. 3 is a diagram showing a configuration of an examination table apparatus according to the embodiment of the present invention.

FIG. 3 is a diagram showing a configuration of the examination table apparatus 300 (examination table apparatus) according to the present embodiment. As shown in FIG. 3, the examination table apparatus 300 includes the top plate 310 on which the subject 110 is placed, a top plate holding part 311, and a body part 340. Further, the examination table apparatus 300 comprises a controller 350, an operation panel 317, and a sliding mechanism 319 (sliding mechanism). It should be noted that, although an aspect is described in the present embodiment in which the examination table apparatus 300 is fixed to the apparatus body 101, the examination table apparatus 300 may be configured separately from the magnetic resonance imaging apparatus 100 so as to be connected to and separated from the apparatus body 101.

The top plate 310 is held by the top plate holding part 311 and is slidable to the inside or the outside of the imaging space by using the examination table moving device 220 (see FIG. 2) in the magnetic resonance imaging apparatus 100. In addition, the examination table apparatus 300 comprises a top plate lock mechanism 315, and the top plate lock mechanism 315 can lock the top plate 310 not to be slidable, or unlock the top plate 310 to be slidable. The top plate locking/unlocking can be realized by inserting and pulling out a locking pin into and from the top plate 310, or by attracting and attraction-releasing a magnet on the top plate 310 side by using an electromagnet provided on the top plate holding part 311 side. Further, the examination table apparatus 300 comprises a top plate raising/lowering mechanism 313 (for example, can be configured by an oil pressure jack, a pantograph, or the like), and the top plate 310 and the top plate holding part 311 can be raised and lowered.

The user can perform, via the operation panel 317, an operation of locking the top plate 310 or an operation of sliding the top plate 310. Information such as a locking state or a sliding state of the top plate 310, a connection state of the connector 322, or a message to the user may be displayed on the operation panel 317. The operation panel 317 (output device) may include a display or a lamp (not shown) for displaying these types of information. Instead of or in addition to these types of display, information may be output by audio via a speaker (not shown).

An opening 320 is provided in the top plate 310, and the connector 322 is slidable (movable) in the opening 320. A detailed configuration and a sliding aspect of the connector 322 will be described later. The sliding of the connector 322 is performed by controlling the sliding mechanism 319 via a sliding controller 352G (processor) (described later).

A camera 400 (imaging apparatus) is provided on an upper part of the examination table apparatus 300. The camera 400 is attached in a state of being directed downward (−Z direction), and can captures images of the top plate 310, the subject and the coil placed on the top plate 310, or the examination table apparatus 300 and the periphery thereof. As will be described in detail later, in the present embodiment, the sliding of the connector 322 can be controlled by using the image captured by the camera 400.

Configuration of Controller

Figure 4:
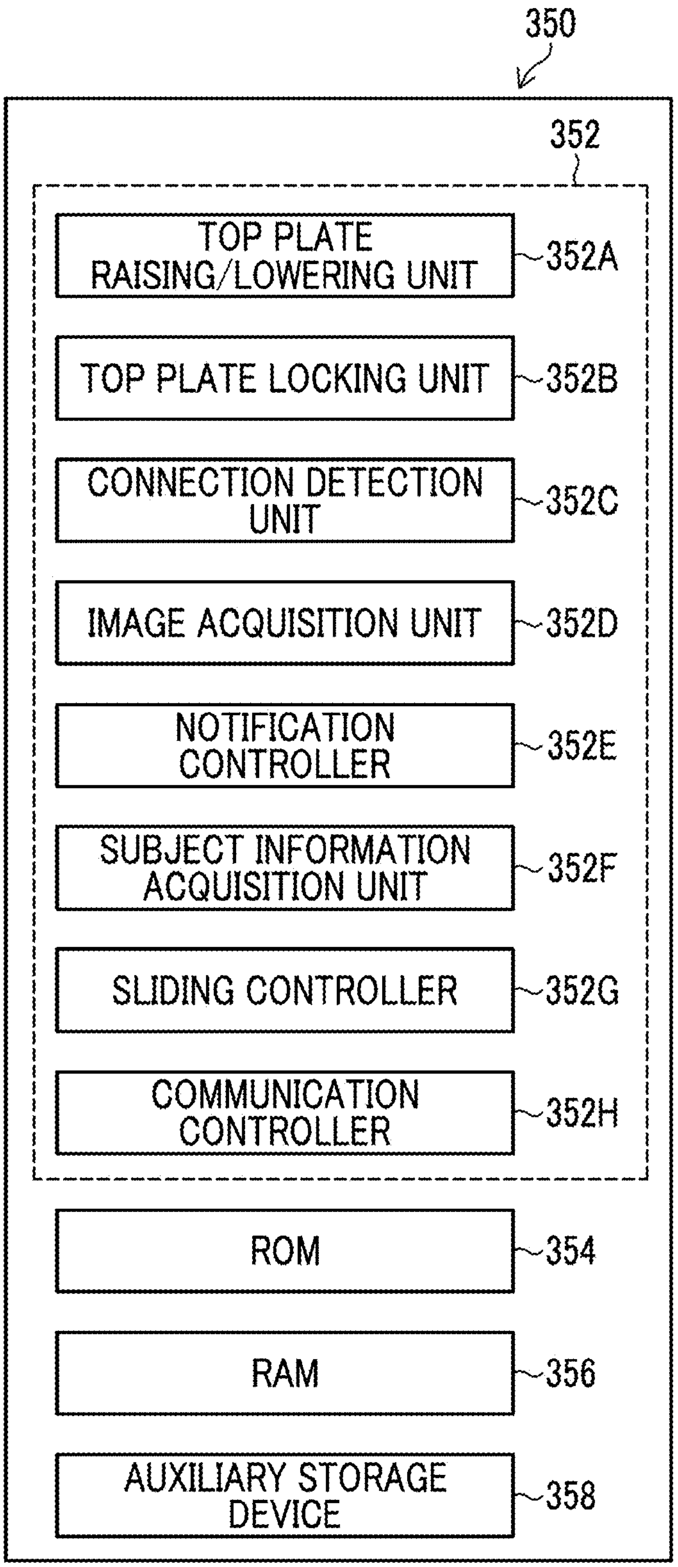
FIG. 4 is a diagram showing a configuration of a controller of the examination table apparatus.

FIG. 4 is a diagram showing a configuration of the controller 350 of the examination table apparatus 300 according to the present embodiment. As shown in FIG. 4, the controller 350 comprises a processor 352, a read only memory (ROM) 354, and a random access memory (RAM) 356. The processor 352 can be configured by various processors in the same manner as in the processor 171. In a case in which these various processors operate, a program or data recorded on a non-transitory and tangible recording medium, such as the ROM 354, can be referred to, and a recording medium, such as the RAM 356, can be used as a transitory work area during the operation. An auxiliary storage device 358 is configured by using various optical magnetic storage devices, semiconductor memories, and the like, and can store information on the coil or the connector (for example, an imaging part, a cable length, and a slidable range of the connector), information on the subject, and the like. The information stored in the auxiliary storage device 358 can be output (display, audio) to the operation panel 317 and the output device 200 (see FIG. 2).

Function of Processor

The processor 352 has, as functions thereof, a top plate raising/lowering unit 352A, a top plate locking unit 352B, a connection detection unit 352C, an image acquisition unit 352D, a notification controller 352E, a subject information acquisition unit 352F, a sliding controller 352G, and a communication controller 352H. The top plate raising/lowering unit 352A controls the top plate raising/lowering mechanism 313 to raise and lower the top plate 310 and the top plate holding part 311, and the top plate locking unit 352B controls the top plate lock mechanism 315 to lock and unlock the top plate 310. The connection detection unit 352C detects that the cable of the coil is connected to or disconnected from the connector 322, and the image acquisition unit 352D acquires the image of the examination subject, the coil, or the like via the camera 400. The notification controller 352E controls the notification to the user by the output (display, audio) of the locking state or the sliding state of the top plate 310, the connection state of the connector 322, the message to the user, or the like, and the subject information acquisition unit 352F acquires subject information including an imaging condition. The sliding controller 352G controls the sliding of the connector 322, and the communication controller 352H controls the communication with the apparatus body 101. The communication control via the communication controller 352H includes acquiring the signal received by the receive coil 161 (coil) via the connector 322 or the like and transmitting the acquired signal to the apparatus body 101.

Disposition of Connector

Figure 5:
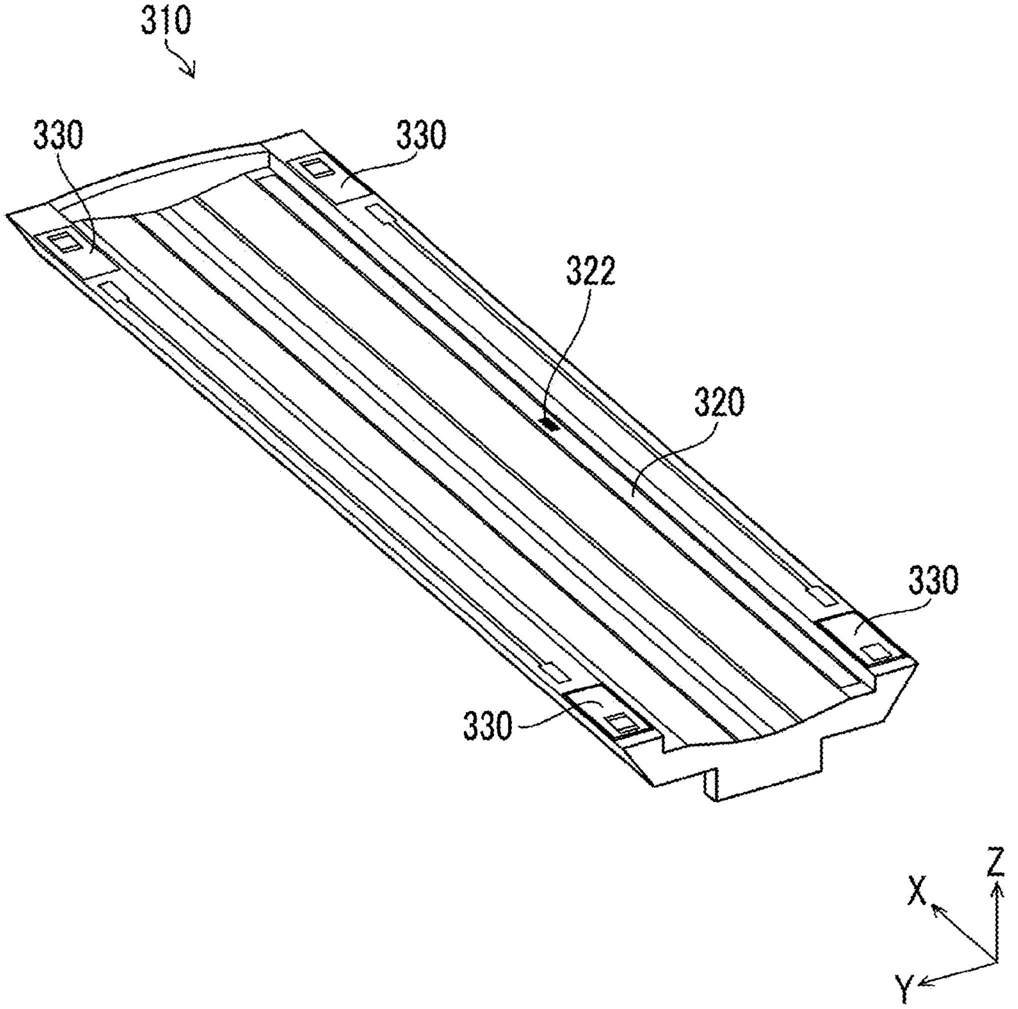
FIG. 5 is a perspective view showing a disposition example of a connector on a top plate.

FIG. 5 is a perspective view showing a disposition example of the connector on the top plate 310. In the example shown in FIG. 5, the connector 322 (connector) is provided on one side (−Y side) of the top plate 310 in a lateral direction. The opening 320 (opening) corresponding to the connector 322 is provided in the top plate 310, and the connector 322 is slidable with respect to the top plate 310 in a longitudinal direction (+X direction) of the top plate 310. The sliding range may be limited to a part of the longitudinal direction, or the connector 322 may be slidable in the entire range.

It should be noted that a groove (one groove corresponding to one connector) may be provided instead of the opening 320. The groove need not penetrate in the Z direction. In addition, the connector 322 may be provided on both sides (+Y side and −Y side) of the top plate 310 in the lateral direction, or a plurality of connectors 322 may be provided (see FIGS. 6A to 6D described later). In a case in which the plurality of connectors 322 are provided, each of the plurality of connectors 322 may be slidable independently of each other. Further, the top plate 310 is provided with a total of four fixed connectors 330 on both end parts (+X side and −X side) in the longitudinal direction, on both sides in the lateral direction.

Disposition and Sliding Range of Connector

FIGS. 6A to 6D are diagrams showing an example of the disposition and the sliding range of the connector. It should be noted that FIGS. 6A to 6D show a state in which a coil 700 is connected to the connector 322 via a cable 702. In the example shown in FIG. 6A, the opening 320 is provided on one side of the top plate 310 in the lateral direction (+Y direction) over substantially the entire range of the longitudinal direction (+X direction). The connector 322 is slidable over substantially the entire range in the longitudinal direction. In the example shown in FIG. 6B, the opening 320 is provided on both sides of the top plate 310 in the lateral direction, and the connector 322 is slidable over substantially the entire range in the longitudinal direction. In a case in which the plurality of connectors 322 are provided in this way, the sliding controller 352G (processor) may slide the plurality of connectors 322 in conjunction with each other, or may slide the plurality of connectors 322 independently of each other.

Figure 6A:
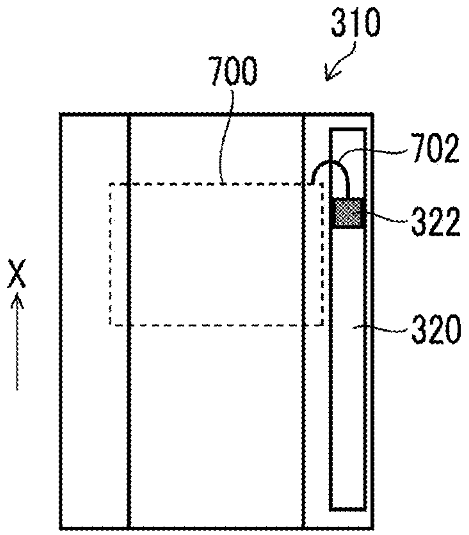
FIGS. 6A to 6D are diagrams showing an example of disposition and a sliding range of the connector.
Figure 6B:
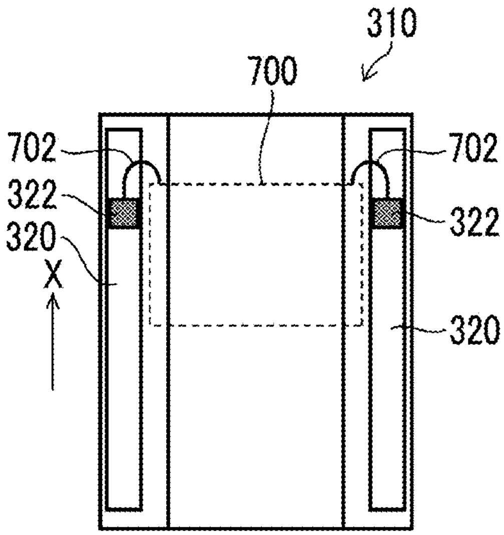
Figure 6C:
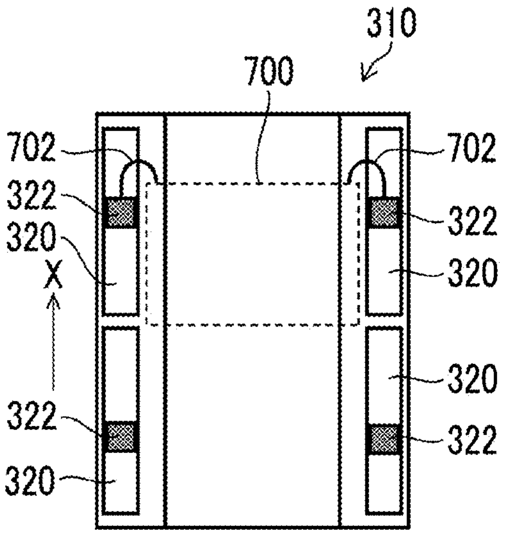
Figure 6D:
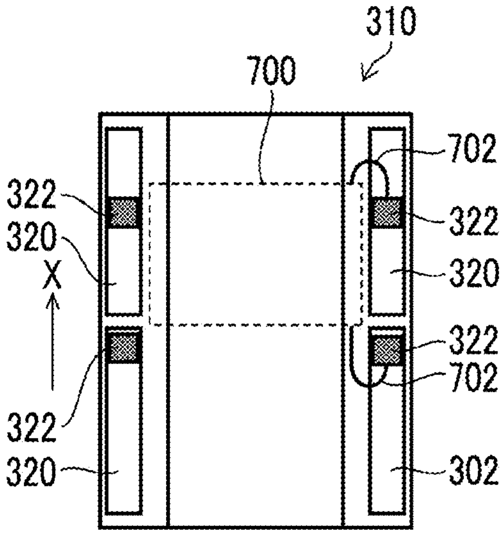

In the example shown in FIGS. 6C and 6D, the plurality of openings 320 are provided in the longitudinal direction on both sides of the top plate 310 in the lateral direction (+Y direction). The openings 320 are provided in a partial range of the longitudinal direction, and the connector 322 is slidable in the partial range in which the openings 320 are provided.

As shown in FIGS. 6A to 6D, the number of cables 702 provided in the coil 700 may be one or two. In addition, in a case in which two cables are provided, the two cables may be connected to the connectors 322 on both sides in the lateral direction (see FIGS. 6B and 6C), or may be connected to the connector 322 on one side (see FIG. 6D).

Connection of Coil for Imaging Different Parts

Figure 7:
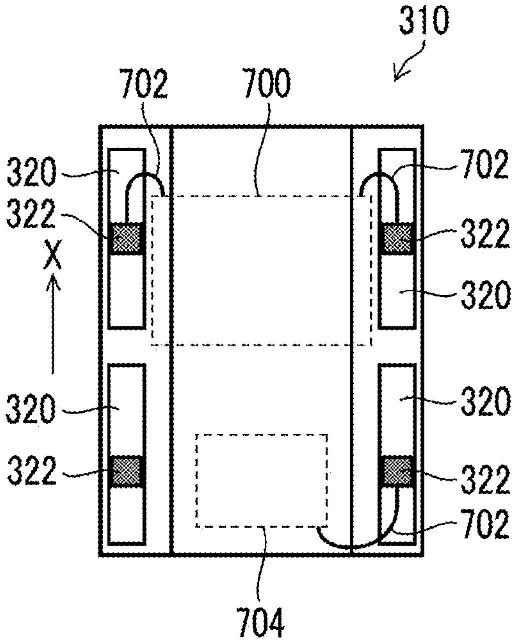
FIG. 7 is a diagram showing a state in which a plurality of coils are connected to the connector.

FIG. 7 is a diagram showing a state in which the plurality of coils are connected to the connector. In the example of FIG. 7, the coil 700 is connected to the connector 322 on the +X side (on the +Y side; both sides in the lateral direction), and a coil 704 is connected to the connector 322 on the −X side (on the −Y side in the example shown). The coil 700 is, for example, a coil for a spine imaging, and the coil 704 is, for example, a coil for leg imaging. That is, according to the present embodiment, the coils for imaging different parts of the subject can be connected to one connector and the other connector among the plurality of connectors 322.

It should be noted that, in addition to an aspect in which the cable is pulled out from the coil and connected to the connector 322 as shown in FIGS. 6A to 6D and FIG. 7, in the present invention, an aspect is also considered in which the cable is eliminated in, for example, a spine coil (coil for a spine). That is, an aspect is also considered in which the cable is hidden inside the spine coil and only the connector is exposed to the exterior.

As described above, according to the present embodiment, an appropriate connection pattern can be selected in accordance with the imaging part or the configuration of the coil (the number of cables, the cable pull-out position, and the like).

Figure 8:
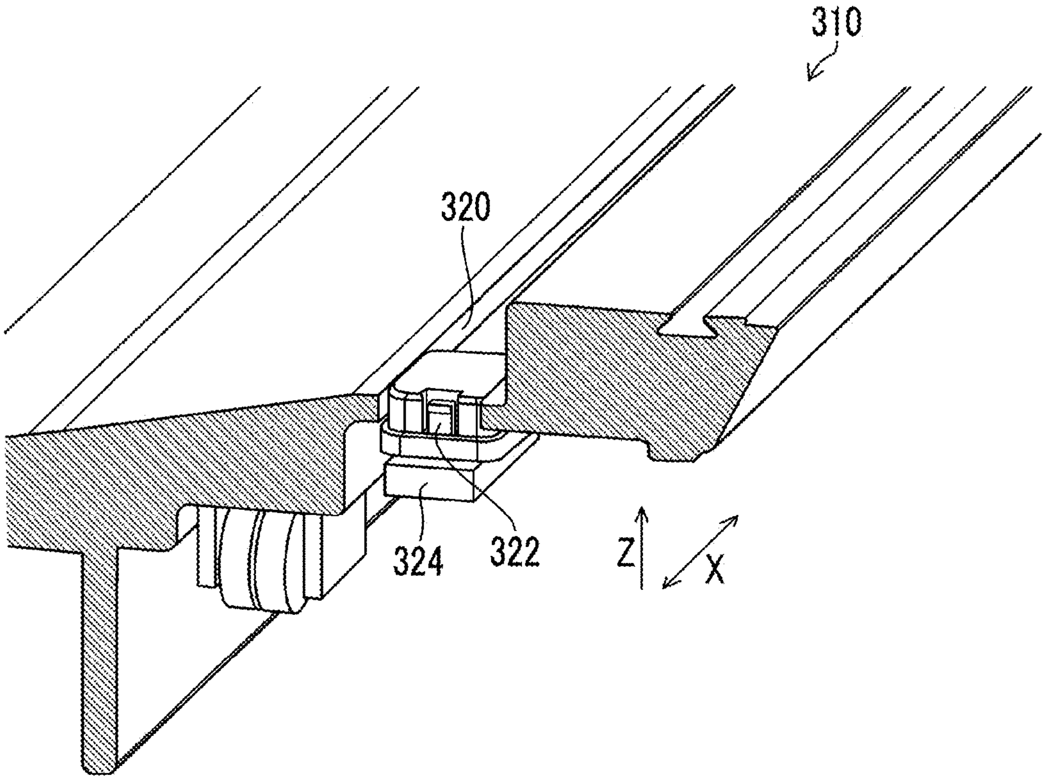
FIG. 8 is a partial cross-sectional view of the top plate in a connector portion.

FIG. 8 is a partial cross-sectional view of the top plate 310 in a portion of the connector 322. As shown in FIG. 8, a support member 324 (a plurality of support members) that supports the connector 322 is provided. The support member 324 is provided to correspond to the connector 322, and there are a plurality of the support members 324 in a case in which there are a plurality of the connectors 322.

Configuration of Sliding Unit

Figure 9:
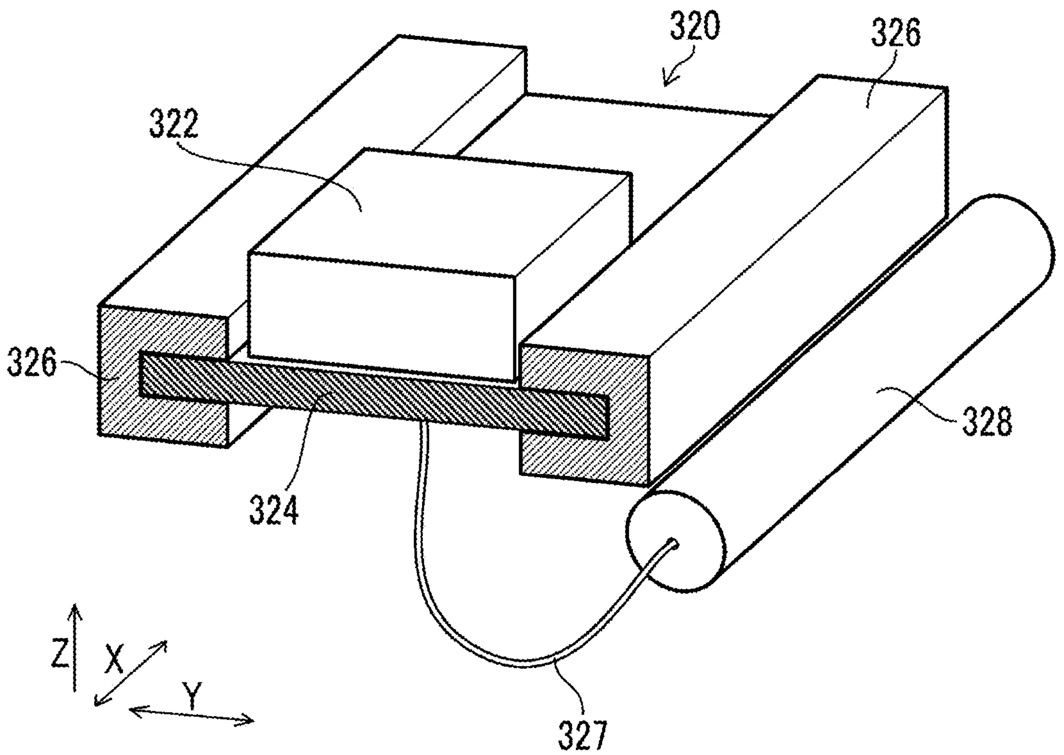
FIG. 9 is a diagram showing a configuration example of a mechanism for sliding the connector.

FIG. 9 is a diagram (showing a part of the X direction) showing a configuration example of a mechanism (sliding unit, sliding mechanism) for sliding the connector 322. In the example of FIG. 9, a holding member 326 (holding member) holds a horizontal-direction end part (+Y side) of the support member 324, and the holding member 326 is disposed on both sides (+Y side) of the top plate 310 in the lateral direction and projected in the longitudinal direction (+X side), and is fixed to the top plate 310. Then, the connector 322 is slid with respect to the top plate 310 in the +X direction by the support member 324 being slid with respect to the holding member 326.

In addition, the cable 327 is pulled out from the connector 322, and the cable 327 is connected to the balun 328. The "balun" is an element for converting electrical signals in a balanced state and in an unbalanced state.

Figure 10A:
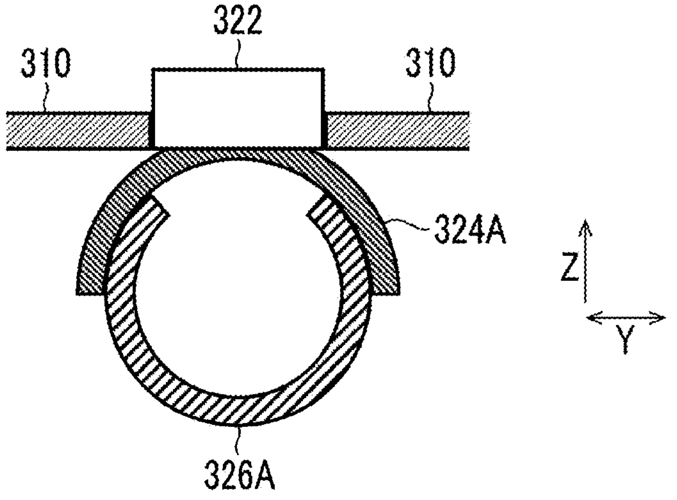
FIGS. 10A and 10B are diagrams showing a configuration example of a sliding unit.
Figure 10B:
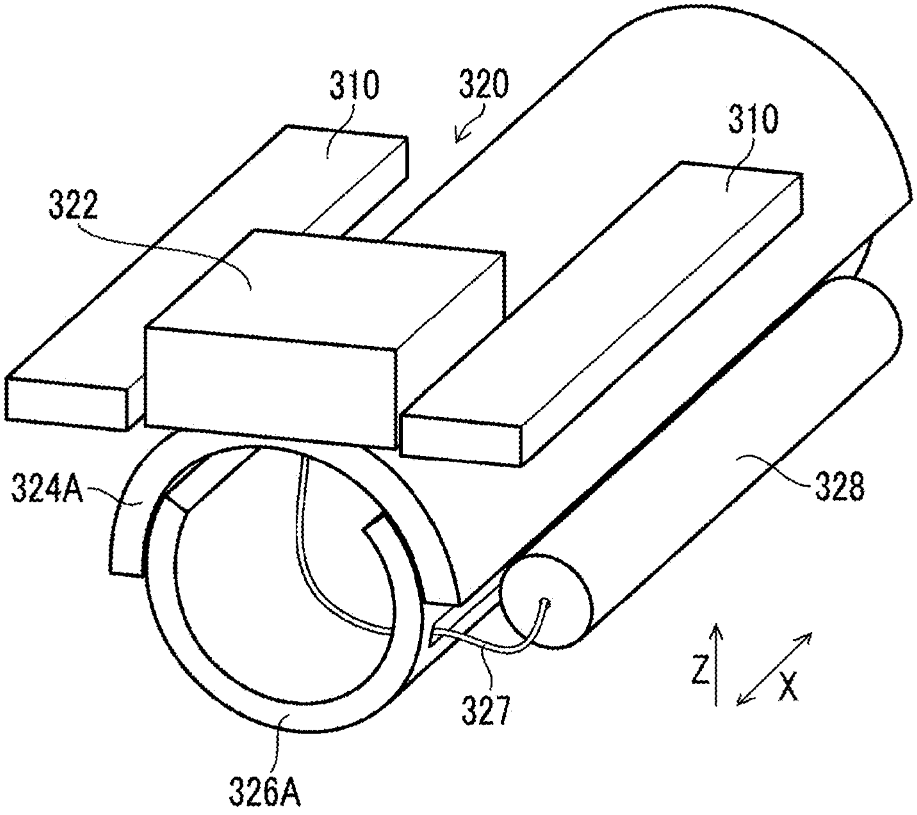

FIGS. 10A and 10B are diagrams showing another configuration example of the sliding unit. In the examples of FIGS. 10A and 10B, the connector 322 is exposed from the opening 320 formed in the top plate 310. As shown in FIG. 10A, a support member 324A (guide) that supports the connector 322 has a semicircular cross section, and a holding member 326A is a cylindrical shape (tubular member) with an open top. The holding member 326A holds at least a part of a vertical-direction lower surface of the support member 324A. The holding member 326A is disposed in the lateral direction of the top plate 310 and projected in the longitudinal direction (+X side), and is fixed to the top plate 310. Then, the sliding controller 352G slides the support member 324A with respect to the holding member 326A, whereby the connector 322 are slid with respect to the top plate 310 in the +X direction (see FIG. 10B). As in the example of FIG. 9, the cable 327 is pulled out from the connector 322, and the cable 327 is connected to the balun 328.

Configuration for Shielding Gap

In the example of FIG. 9 described above, a gap between the connector 322 and the opening 320 is shielded by the support member 324, and in the examples of FIGS. 10A and 10B, a gap is shielded by at least the support member 324A, and a hole does not penetrate in the Z direction. As a result, the pinching of the body (fingers or the like) of the user or the subject, the spilling of the liquid, the dropping of the article, and the like can be prevented. In the aspects of FIG. 9 and FIGS. 10A and 10B, the shielding can be performed by making the support member 324 or the support member 324A longer in the X direction than the opening 320 (for example, two times or more the length of the opening 320 in the X-direction), but it may be difficult to make the support member longer depending on the length of the opening 320 (sliding range of the connector 322), in this case, the shielding of the gap may be performed by another configuration such as a configuration shown in FIG. 11C (the hole can be prevented from penetrating by providing a belt in a range of the opening 320). In addition, an aspect may be adopted in which the connector is slid in a "groove" through which the hole does not penetrate, instead of the aspect in which the connector slides in the opening.

It should be noted that, in the present embodiment, the sliding mechanism 319 (sliding mechanism) is configured by the sliding unit shown in FIG. 9 and FIGS. 10A and 10B, a controller (see examples of FIGS. 11A to 11C) described later, and a motor or the like (drive unit) (see FIG. 12 and the description thereof).

Control of Controller

Figure 11A:
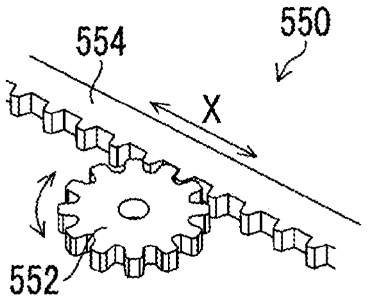
FIGS. 11A to 11C are diagrams showing a configuration example for controlling the sliding unit.
Figure 11B:
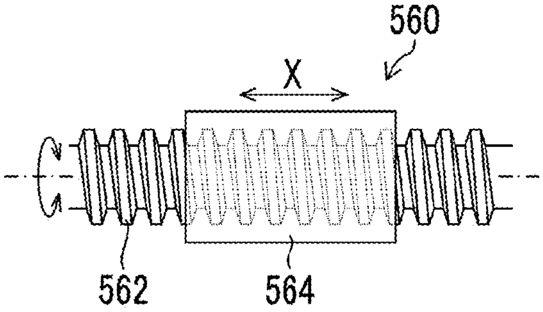
Figure 11C:
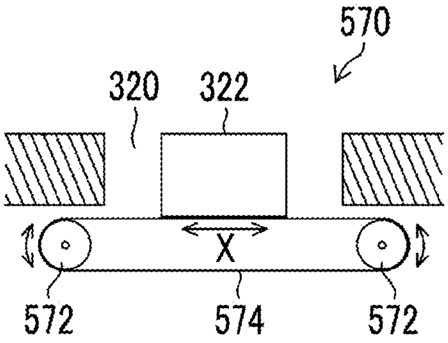

FIGS. 11A to 11C are diagrams showing an example of a configuration (controller, sliding mechanism) for controlling the sliding unit described above. In a controller 550 shown in FIG. 11A, a pinion 552 (fixed to the top plate 310) and a rack 554 are engaged with each other, and the rack 554 can be parallel-translated by rotating the pinion 552 (or a dial or the like in conjunction with the pinion 552) via the sliding controller 352G (processor) with a motor or the like (not shown). Therefore, it is possible to slide the connector (not shown) by fixing the connector to the rack 554.

In a controller 560 shown in FIG. 11B, a ball screw 562 projected in the longitudinal direction of the top plate 310 is rotated by the sliding controller 352G (by a motor or the like, not shown), whereby a nut 564 is caused to perform linear movement. Therefore, it is possible to slide the connector 322 by fixing the connector 322 to the nut 564.

In the controller 570 shown in FIG. 11C, two shaft members 572 that rotate around the Y axis are provided in the X direction, and a belt 574 is wound around the peripheries of the shaft members 572. Then, the sliding controller 352G rotates the shaft member 572 (by a motor or the like, not shown), whereby the belt 574 is transported in the X direction. Therefore, it is possible to slide the connector 322 by fixing the connector 322 to the belt 574.

Figure 12:
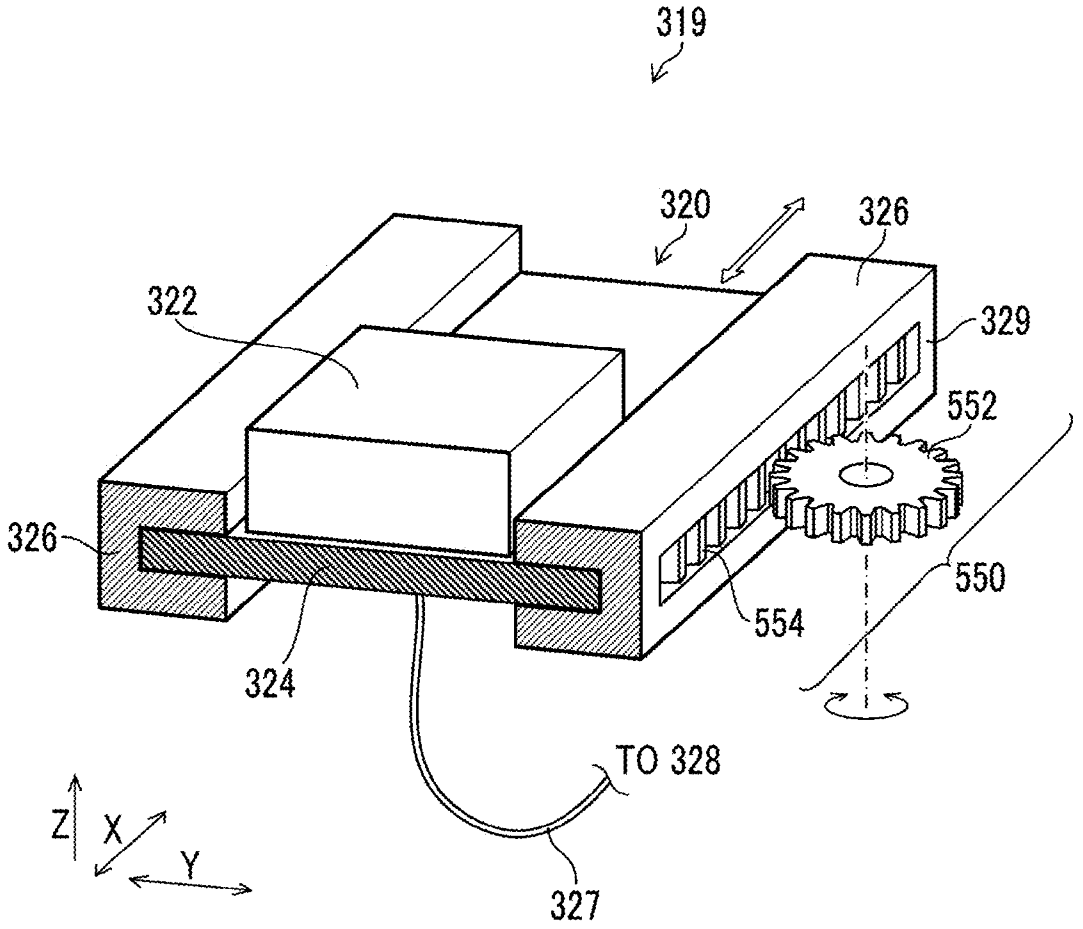
FIG. 12 is a schematic diagram showing an example of a sliding mechanism.

FIG. 12 is a schematic diagram showing an example of the sliding mechanism 319 (sliding mechanism). In the example shown in FIG. 12, the controller 550 shown in FIG. 11A is applied to the sliding unit shown in FIG. 9. In the example shown in FIG. 12, an opening 329 is provided in the holding member 326 (one in the Y direction), and the rack 554 is exposed from the opening 329. The rack 554 is fixed to the support member 324. Therefore, as described above for FIG. 11A, the rack 554 can be parallel-translated by rotating the pinion 552 (or the dial or the like in conjunction with the pinion 552) by the sliding controller 352G with the motor or the like (not shown), and thus the connector 322 can be slid. This configuration can also be adopted in a case in which the connector 322 slides in the groove instead of the opening.

As in the example of FIG. 12, the sliding mechanism 319 (sliding mechanism) can be configured even in a case in which the controllers 560 and 570 are used, and thus the sliding controller 352G can slide the connector 322.

First Aspect of Sliding Control of Connector

Figure 13:
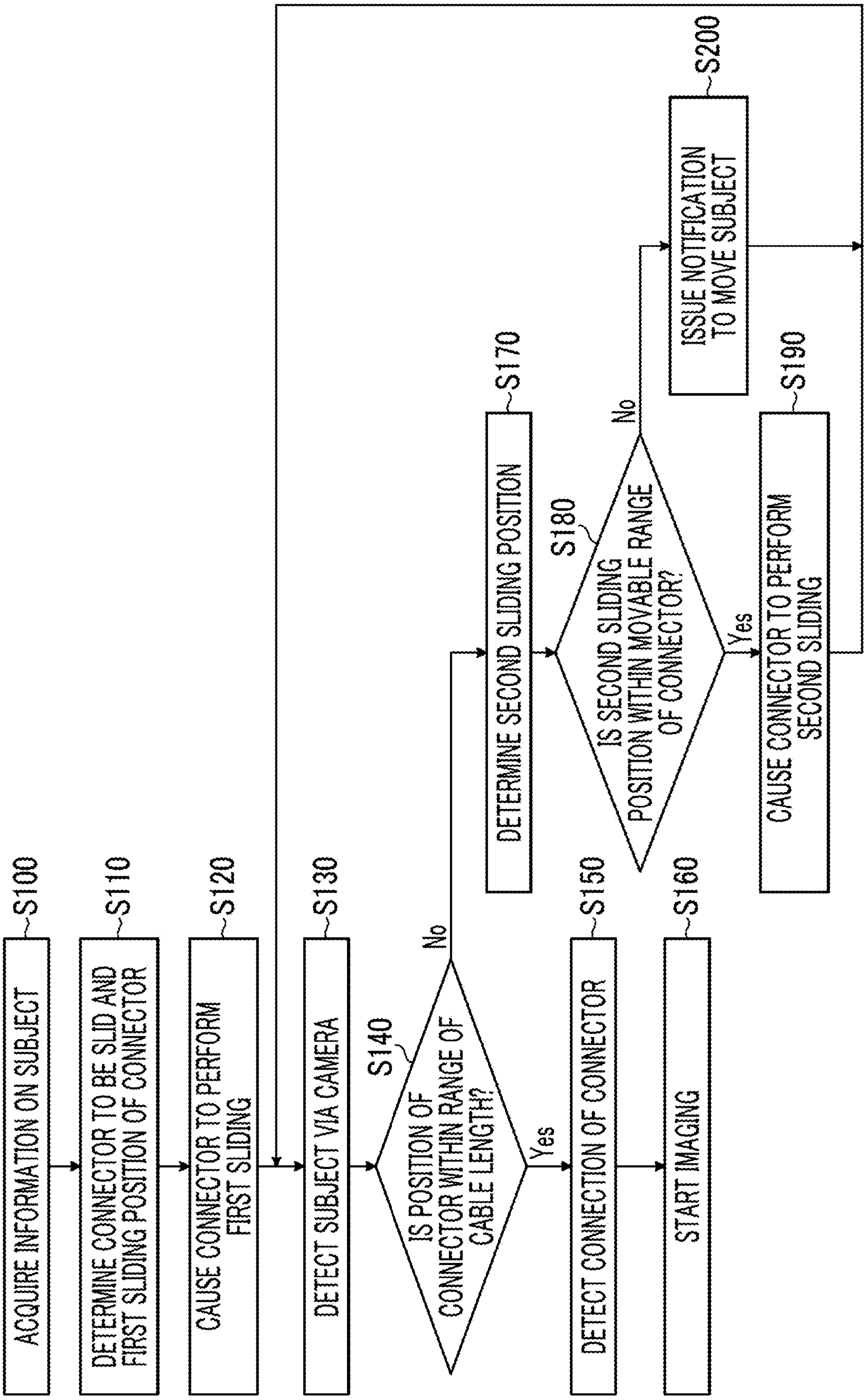
FIG. 13 is a flowchart showing processing of sliding control of the connector.

FIG. 13 is a flowchart showing processing of sliding control of the connector (first aspect). For example, in a case in which the user operates the operation panel 317 to issue an instruction to start the sliding of the connector 322, the subject information acquisition unit 352F (processor 352) acquires the information on the subject (step S100). The information on the subject may include the imaging condition of the subject, and may further include information on the subject, such as a name, ID, an age, a height, or a weight. The imaging condition may include an imaging part (which position of the top plate is installed at the magnetic field center (imaging center)) and a body orientation of the subject (whether the subject enters the magnetic field from the head or from the foot, whether the subject is in a prone state or in a supine state). The imaging condition may include information on the coil (which coil is used, the number of cables of the coil, the cable length, or the like). The user may input the information on the subject from the input device 210 (see FIG. 2), or may issue an instruction to use the information already stored in the external storage device 180 or the like. The user may input necessary information from the operation panel 317 of the examination table apparatus 300.

First Sliding

The sliding controller 352G (processor 352) determines a sliding target connector (connector caused to perform the first sliding) and a target position (first sliding position) of the sliding target connector at least based on the imaging condition (step S110). The sliding controller 352G may determine the sliding target connector in consideration of the disposition of the connector (one connector on one side, a plurality of connectors on both sides, and the like) as shown in FIGS. 6A to 6D, the slidable range of the connector (entire range or a part of the range in the longitudinal direction), the type of the coil used for imaging (for the head, for the spine, for the abdomen, and the like), the size of the coil, the number of coils, the number of cables, the length of the cable, the pull-out position of the cable, and the like. In addition, the sliding controller 352G may determine the connector of which a sliding amount is minimized as the sliding target connector.

The sliding controller 352G controls the sliding mechanism to cause the sliding target connector to perform the first sliding (slide to the first sliding position) (step S120). In a case in which the sliding target connector and the target position thereof are determined, the sliding controller 352G can determine a movement direction and a movement amount (sliding direction and sliding amount) of the sliding target connector based on a relationship with a current connector position, and can cause the sliding target connector to perform the first sliding. It should be noted that the movement direction and the movement amount can be collectively referred to as a “first sliding vector”.

It should be noted that the “first sliding” may be rough sliding. The sliding controller 352G may cause the first sliding to be performed in consideration of the information on the subject other than the imaging condition.

It is preferable that the notification controller 352E (processor 352) notifies of a case in which the first sliding is completed or a case in which the first sliding cannot be executed due to some problem, by turning on a lamp or a switch, displaying an image, a character, an icon, or the like, or performing audio output. The notification controller 352E may perform the notification on the operation panel 317 or may perform the notification on the display 201 (see FIG. 2).

The image acquisition unit 352D acquires the image of the subject via the camera 400 (imaging apparatus) (it is assumed that the subject is placed on the top plate 310 in a state of lying down in a supine state, lying down in a prone state, or the like in this case), and detects the subject (step S130). The image acquisition unit 352D can detect the subject from the image, for example, by using a feature value recognition such as face recognition, a detector constructed by machine learning, or the like. This detection may also include detection of a subject position.

It should be noted that the sliding control as in the first aspect can be performed, for example, in a case in which the coil is installed on a front surface side (+Z side) of the subject after the subject lies down on the top plate 310. Therefore, in a case of acquiring the image of the subject in step S130, the coil is not attached to the subject. After the sliding of the connector 322 is completed, the coil need only be attached to the subject to connect the cable to the connector 322.

The sliding controller 352G determines whether or not the cable length required to connect the coil used for the imaging to the connector 322 that has performed the first sliding is within a range of the cable length of the coil (that is, whether or not the coil can be connected without further sliding the connector 322) (step S140). The sliding controller 352G can perform the determination in step S140 based on the subject position, the imaging condition, the information on the subject, and the information on the coil detected in step S130. It should be noted that the "information on the coil" is, for example, information on which part is imaged by the coil, the shape and the size, the number of cables and the pull-out position, the cable length, and the like, and these types of information can be stored in the auxiliary storage device 358, the external storage device 180 (see FIG. 2), or the like.

It should be noted that, in the first sliding and second sliding described later, it is preferable that the sliding controller 352G (processor) slides the connector to a position overlapping a range in which the coil is present in the longitudinal direction of the top plate 310 in a case in which the subject in a state in which the coil is attached is placed on the top plate 310. As a result, it is possible to shorten the cable routing.

In a case in which an affirmative determination is made in step S140, the cable can be connected to the connector 322 in a state in which the position of the connector 322 is maintained as it is, so that it is not necessary to perform the second sliding, which will be described later. In such a case, the processing proceeds to step S150.

Second Sliding

In a case in which a negative determination is made in step S140, the cable cannot be connected unless the sliding target connector is further slid. Therefore, the sliding controller 352G determines a target position (second sliding position) of the second sliding based on the subject position calculated from the image of the subject (step S170), and determines whether or not the determined second sliding position falls within a movable range (slidable range) of the sliding target connector (step S180). The target position of the second sliding is a position at which the sliding target connector falls within a range of the cable length of the coil. In addition, in a case in which the second sliding position is determined, the sliding controller 352G can determine the movement direction and the movement amount of the connector based on a relationship with the connector position after the first sliding, and can cause the connector to perform the second sliding. It should be noted that the movement direction and the movement amount can be collectively referred to as a "second sliding vector".

It should be noted that, in step S180, the sliding controller 352G can consider, for example, the length or the end part position of the holding member, the support member, or the opening, a position relationship with an adjacent connector, the presence or absence of a mat or other articles or obstacles (which can be detected from the image acquired by the camera 400).

In a case in which the above-described determination is made as being affirmative (in a case of YES in step S180), that is, in a case in which the second sliding position falls within the movable range of the connector 322, the cable can be connected by the second sliding, and thus the sliding controller 352G cause the sliding target connector to perform the second sliding (step S190), and returns to step S130. In a case in which the above-described determination is made as being negative (in a case of NO in step S180), that is, in a case in which the second sliding position does not fall within the movable range of the connector 322, the cable cannot be connected even in a case in which the sliding target connector is caused to perform the second sliding, so that the notification controller 352E (processor) issues the notification to the user. The notification controller 352E displays, for example, a message prompting the user to move the subject on the top plate 310, on the operation panel 317 (output device) and/or the display 201 (output device) (step S200). A message voice may be output from a speaker (output device) (not shown). In a case in which the user moves the subject in accordance with the notification, the processing returns to step S130.

In the above-described second sliding, the sliding position of the connector 322 can be finely adjusted based on the image captured by the camera 400.

After the sliding of the connector 322 is completed (including a case in which only the first sliding is performed and a case in which the first sliding and the second sliding are performed), the cable of the coil can be connected to the connector 322. The user may perform the connection by himself/herself, or a connection mechanism (not shown) may be provided to automatically perform the connection. The connection detection unit 352C (processor 352) detects whether or not the coil is connected to the connector 322 (step S150). It is preferable that the notification controller 352E issues the notification in accordance with the detection of the connection. The notification controller 352E can issue the notification via the operation panel 317, the display 201, or the like. It should be noted that, in a case in which the connection detection unit 352C cannot detect the connection within a predetermined time, it is preferable that the controller 350 and the controller 170 (see FIG. 2) stop the start of the imaging, and the notification controller 352E outputs a warning.

In a case in which the connection is detected, the imaging of the subject is started in accordance with a predetermined sequence under the control of the controller 170 of the magnetic resonance imaging apparatus 100 or the like (step S160).

After the imaging is terminated, the cable (coil) is removed by the user or automatic control, but it is preferable that the connection detection unit 352C detects the removal of the cable in the same manner as in a case of the connection, and the notification controller 352E issues the notification. In a case in which the removal of the cable is detected, it is preferable that the sliding controller 352G automatically slides the connector 322 to a predetermined position after a lapse of a predetermined time (not particularly limited, but for example, about several seconds). In addition, in a case in which the imaging based on one imaging condition is terminated and another imaging condition (another examination information) is designated, the processor 352 may slide the connector 322 based on the other imaging condition.

Second Aspect of Sliding Control of Connector

Figure 14:
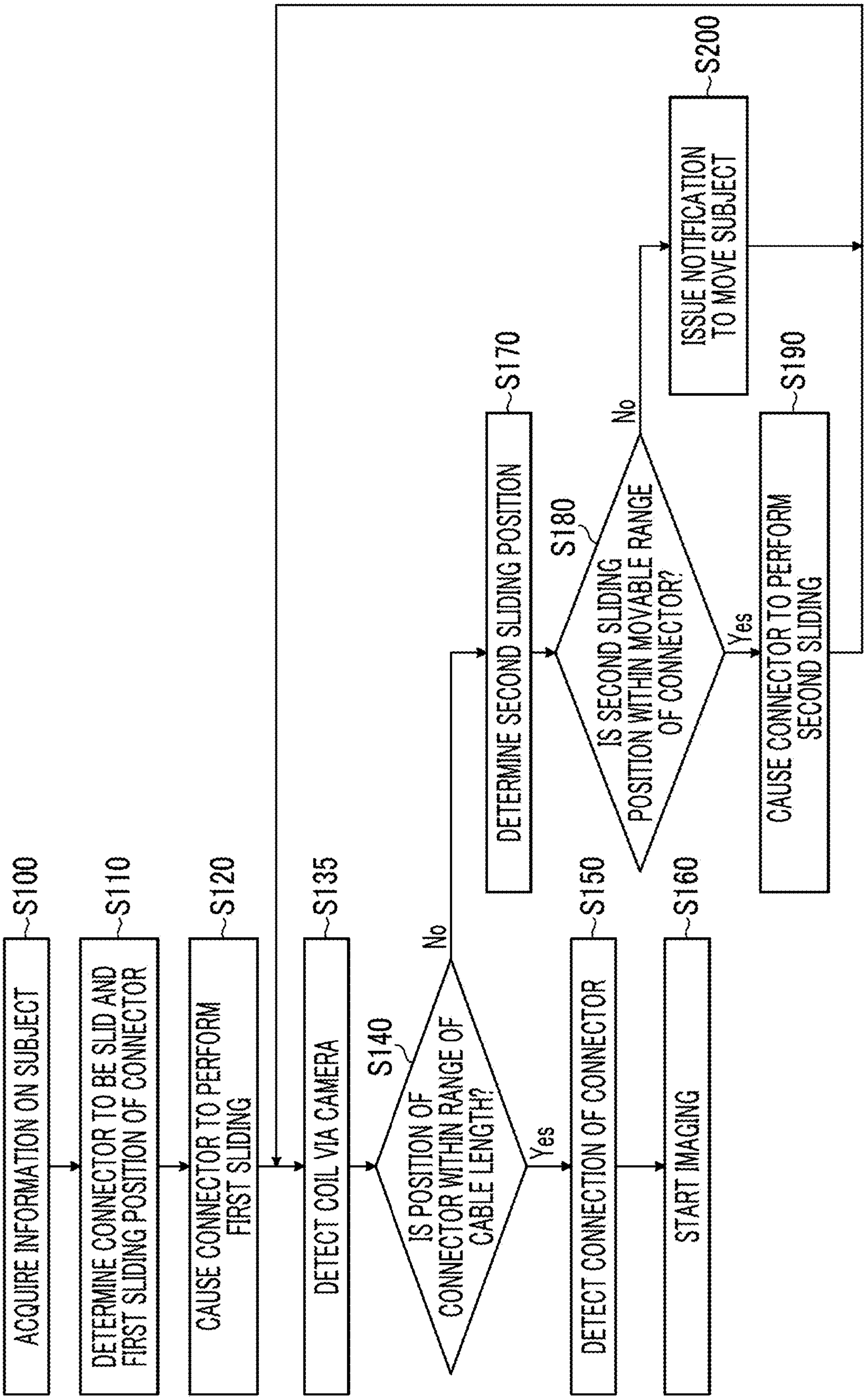
FIG. 14 is a flowchart showing another example of the sliding control.

FIG. 14 is a flowchart of a second aspect of the sliding control. Although the subject is detected from the image captured by the camera 400 (step S130) in the first aspect described above, the coil is detected from the image captured by the camera 400 (step S135) in the second aspect. Since the other processing is the same as the processing of the flowchart of FIG. 14, the same processing is designated by the same step numbers, and the detailed description thereof will not be repeated.

The sliding control according to the second aspect can be performed, for example, in a case in which a coil (coil having a sheet shape) is installed on a back surface side of the subject. Therefore, in a case in which the image of the coil is acquired in step S130, the subject need not lie down on the top plate 310. After the sliding of the connector 322 is completed, the subject need only lie down on the coil and attach the coil (wind the end part of the sheet around the abdomen side, and the like), and the cable need only be connected to the connector 322.

As described above, with the examination table apparatus 300 and the magnetic resonance imaging system 10 according to the present embodiment, the sliding controller 352G (controller 350, processor 352; processor) automatically slides the connector 322 based on the imaging condition and the like, so that the burden placed on the user regarding the sliding of the connector can be reduced.

Although the embodiment according to the present invention has been described above, it goes without saying that the present invention is not limited to the above-described embodiment, and various modifications can be made.

EXPLANATION OF REFERENCES

10: magnetic resonance imaging system
100: magnetic resonance imaging apparatus
101: apparatus body
102: tunnel
300: examination table apparatus
310: top plate
311: top plate holding part
313: top plate raising/lowering mechanism
315: top plate lock mechanism
317: operation panel
319: sliding mechanism
320: opening
322: connector
340: body part
350: controller
400: camera

What is claimed is:

1. An examination table apparatus used in a medical imaging apparatus, the examination table apparatus comprising:
- a top plate on which a subject is placed;
- a connector that is provided on the top plate and to which a coil for capturing an image of the subject is connected;
- a processor;
- a sliding mechanism that slides the connector in a longitudinal direction of the top plate, and
- an imaging apparatus configured to capture images of the subject and the coil,
- wherein the processor is configured to:
  - acquire an imaging condition of the subject;
  - control the sliding mechanism based on the acquired imaging condition, to cause the connector to perform first sliding,
  - determine whether or not a cable length required to connect the coil to the connector that has performed the first sliding is within a range of a cable length of the coil, based on an image acquired by the imaging apparatus;
  - in a case in which the determination is made as being negative, determine a second sliding position that is a target position of second sliding for moving the connector that has performed the first sliding into the range of the cable length of the coil;
  - in a case in which the second sliding position falls within a movable range of the connector, slide the connector to the second sliding position; and
  - in a case in which the second sliding position does not fall within the movable range of the connector, cause an output device to output a message prompting a user of the examination table apparatus to move the subject.

2. The examination table apparatus according to claim 1, wherein the processor is configured to:
- determine a connector that is caused to perform the first sliding among the connectors and a first sliding position that is a target position of the first sliding, based on the imaging condition; and
- slide the determined connector to the determined first sliding position.

3. The examination table apparatus according to claim 1, wherein the processor is configured to:
- in a case in which the determination is made as being affirmative, detect whether or not the coil is connected to the connector.

4. The examination table apparatus according to claim 1, wherein the processor is configured to:
- perform the determination based on the image of the subject acquired by the imaging apparatus.

5. The examination table apparatus according to claim 1, wherein the processor is configured to:
- perform the determination based on the image of the coil acquired by the imaging apparatus.

6. The examination table apparatus according to claim 1, wherein the imaging condition includes at least an imaging part of the subject.

7. The examination table apparatus according to claim 1, wherein the connector includes a plurality of connectors, and
the processor is configured to slide the plurality of connectors independently of each other.

8. The examination table apparatus according to claim 1, wherein the processor is configured to:
- in a case in which the coil is removed from the connector, slide the connector to a predetermined position.

9. The examination table apparatus according to claim 1, wherein the processor is configured to:
- in a case in which imaging based on one imaging condition is terminated and another imaging condition is designated, slide the connector based on the other imaging condition.

10. The examination table apparatus according to claim 1, wherein the top plate has an opening or a groove that is formed in the longitudinal direction of the top plate, and
the connector is slidable in the opening or the groove.

11. The examination table apparatus according to claim 10, further comprising:
- a support member that supports the connector; and a holding member that holds the support member, that is disposed in a lateral direction of the top plate and projected in the longitudinal direction, and that is fixed to the top plate, wherein the processor is configured to:

slide the support member with respect to the holding member via the sliding mechanism, to slide the connector.

12. The examination table apparatus according to claim 11, wherein a gap between the connector and the opening or the groove is shielded by at least one of the support member or the holding member.

13. The examination table apparatus according to claim 1, wherein the processor is configured to:

in a case in which the subject in a state in which the coil is attached is placed on the top plate, slide the connector to a position overlapping a range in which the coil is present in the longitudinal direction of the top plate.

14. The examination table apparatus according to claim 1, wherein the medical imaging apparatus is a magnetic resonance imaging apparatus.

15. A medical imaging system comprising:

the examination table apparatus according to claim 1; and the medical imaging apparatus.

* * * * *